United States Patent
Zhang et al.

(10) Patent No.: US 11,863,136 B2
(45) Date of Patent: Jan. 2, 2024

(54) ELECTRONIC CIRCUITS AND SEMICONDUCTOR DEVICE HAVING THE SAME

(71) Applicant: INNOSCIENCE (ZHUHAI) TECHNOLOGY CO., LTD., Zhuhai (CN)

(72) Inventors: Tao Zhang, Zhuhai (CN); Yulin Chen, Zhuhai (CN); Jihua Li, Zhuhai (CN); Wenjie Lin, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 750 days.

(21) Appl. No.: 16/975,145

(22) PCT Filed: Jul. 15, 2020

(86) PCT No.: PCT/CN2020/102172
§ 371 (c)(1),
(2) Date: Aug. 24, 2020

(87) PCT Pub. No.: WO2022/011610
PCT Pub. Date: Jan. 20, 2022

(65) Prior Publication Data
US 2022/0376664 A1    Nov. 24, 2022

(51) Int. Cl.
*H03F 3/217*     (2006.01)

(52) U.S. Cl.
CPC .................. *H03F 3/2176* (2013.01)

(58) Field of Classification Search
CPC ......... H03F 3/2176; H02J 50/80; H02J 50/12; H02J 7/007182; H02J 7/06
See application file for complete search history.

(56) References Cited

U.S. PATENT DOCUMENTS

| 5,166,595 | A | 11/1992 | Leverich | |
| 6,349,044 | B1 * | 2/2002 | Canales-Abarca | ..... H02M 1/34 |
| | | | | 363/56.08 |

FOREIGN PATENT DOCUMENTS

| CN | 101355264 A | 1/2009 |
| CN | 101719686 A | 6/2010 |

(Continued)

OTHER PUBLICATIONS

International Search Report and Written Opinion of the corresponding PCT application No. PCT/CN2020/102172 dated Mar. 26, 2021.
(Continued)

*Primary Examiner* — Andrea Lindgren Baltzell
*Assistant Examiner* — Khiem D Nguyen
(74) *Attorney, Agent, or Firm* — JCIPRNET

(57) ABSTRACT

The electronic circuits and semiconductor device having the same are provided. The electronic circuit includes: a first transistor including a first electrode coupled with an input voltage; a second transistor including a first electrode coupled with a second electrode of the first transistor; a first capacitor coupled between the first transistor and the second transistor; a first diode including a first terminal coupled with the first electrode of the first transistor; a second diode including a first terminal coupled with a second terminal of the first diode and a second terminal coupled with a second electrode of the second transistor; a second capacitor coupled between the first transistor and the first diode; and a third capacitor coupled between the first diode and the second transistor.

15 Claims, 12 Drawing Sheets

(56) References Cited

FOREIGN PATENT DOCUMENTS

CN   103151986 A   6/2013
CN   104065351 A   9/2014

OTHER PUBLICATIONS

Tao Zhang, "Study on Electric Vehicle LLC Resonant Charging Power Supply System Based on STM32", China's Excellent Master's Thesis, Feb. 15, 2017, No. 02.

* cited by examiner

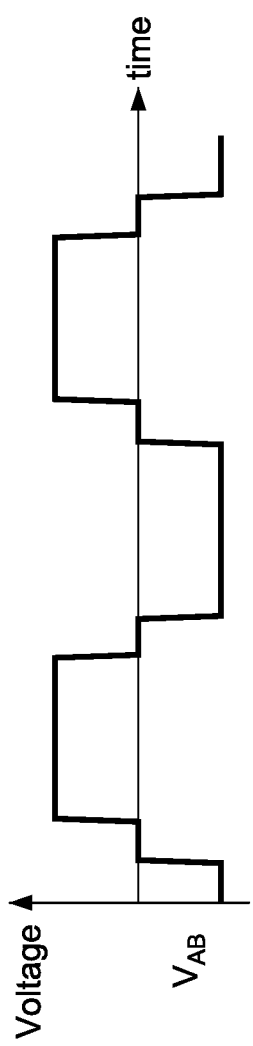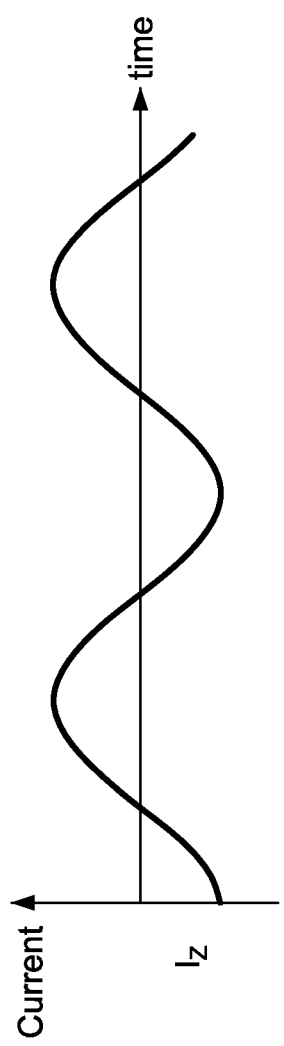

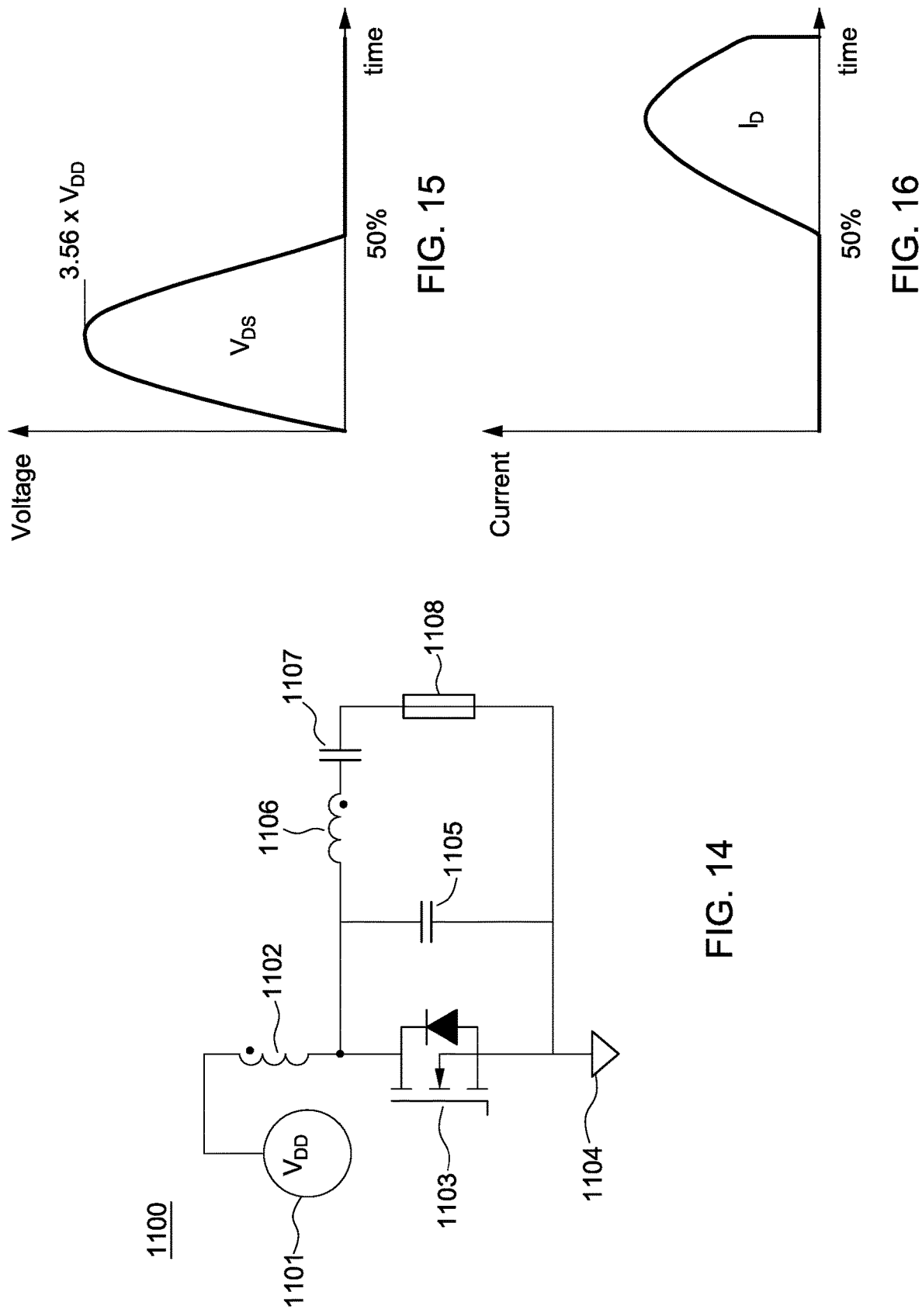

ELECTRONIC CIRCUITS AND SEMICONDUCTOR DEVICE HAVING THE SAME

BACKGROUND

1. Technical Field

The present disclosure relates to an electronic circuit, and more particularly to a semiconductor device having the same.

2. Description of the Related Art

A charger, either cable or wireless charger, is required to charge an electronic device (e.g. mobile phone, laptop, electric car, etc.) with relatively great speed. A charger's transmitter, which may include a power amplifier and other components, can transmit or provide power to the electronic device. A class-E or class-D power amplifier may include some silicon-based transistors (e.g., MOSFETs or CMOSs); however, a relatively great voltage could damage the silicon-based transistors.

SUMMARY

Some embodiments of the present disclosure provide an electronic circuit, which includes a first transistor, a second transistor, a first capacitor, a first diode, a second diode, a second capacitor, and a third capacitor. The first transistor includes a first electrode coupled with an input voltage and a second electrode. The second transistor includes a first electrode coupled with the second electrode of the first transistor and a second electrode coupled to a ground. The first capacitor is coupled between the first electrode of the first transistor and the second electrode of the second transistor. The first diode includes a first terminal coupled with the first electrode of the first transistor and a second terminal. The second diode includes a first terminal coupled with the second terminal of the first diode and a second terminal coupled with the second electrode of the second transistor. The second capacitor is coupled between the first electrode of the first transistor and the second terminal of the first diode. The third capacitor is coupled between the second terminal of the first diode and the second electrode of the second transistor.

Some other embodiments of the present disclosure provide an electronic circuit as described above, and the electronic circuit further includes: a third transistor and a fourth transistor. The third transistor includes a first electrode coupled with the input voltage and a second electrode coupled with the first electrode of the first transistor. The fourth transistor includes a first electrode coupled with the second electrode of the second transistor and a second electrode coupled with the ground.

Some more embodiments of the present disclosure provide an integrated circuit which includes an electronic circuit as described above.

Some more embodiments of the present disclosure provide a semiconductor device which includes an electronic circuit as described above.

Some more embodiments of the present disclosure provide a circuit board which includes an electronic circuit as described above.

BRIEF DESCRIPTION OF THE DRAWINGS

The aspects of the present disclosure will become more comprehensible from the following detailed description made with reference to the accompanying drawings. It should be noted that, various features may not be drawn to scale. Actually, the sizes of the various features may be increased or reduced arbitrarily for the purpose of clear description.

FIG. 10 illustrates a waveform of voltage of an amplifier according to some embodiments of the present disclosure.

FIG. 11 illustrates a waveform of current of an amplifier according to some embodiments of the present disclosure.

FIG. 14 is a schematic circuit diagram of an amplifier according to some embodiments of the present disclosure.

FIG. 15 illustrates a waveform of voltage of an amplifier according to some embodiments of the present disclosure.

FIG. 16 illustrates a waveform of current of an amplifier according to some embodiments of the present disclosure.

DETAILED DESCRIPTION

Figure 1:
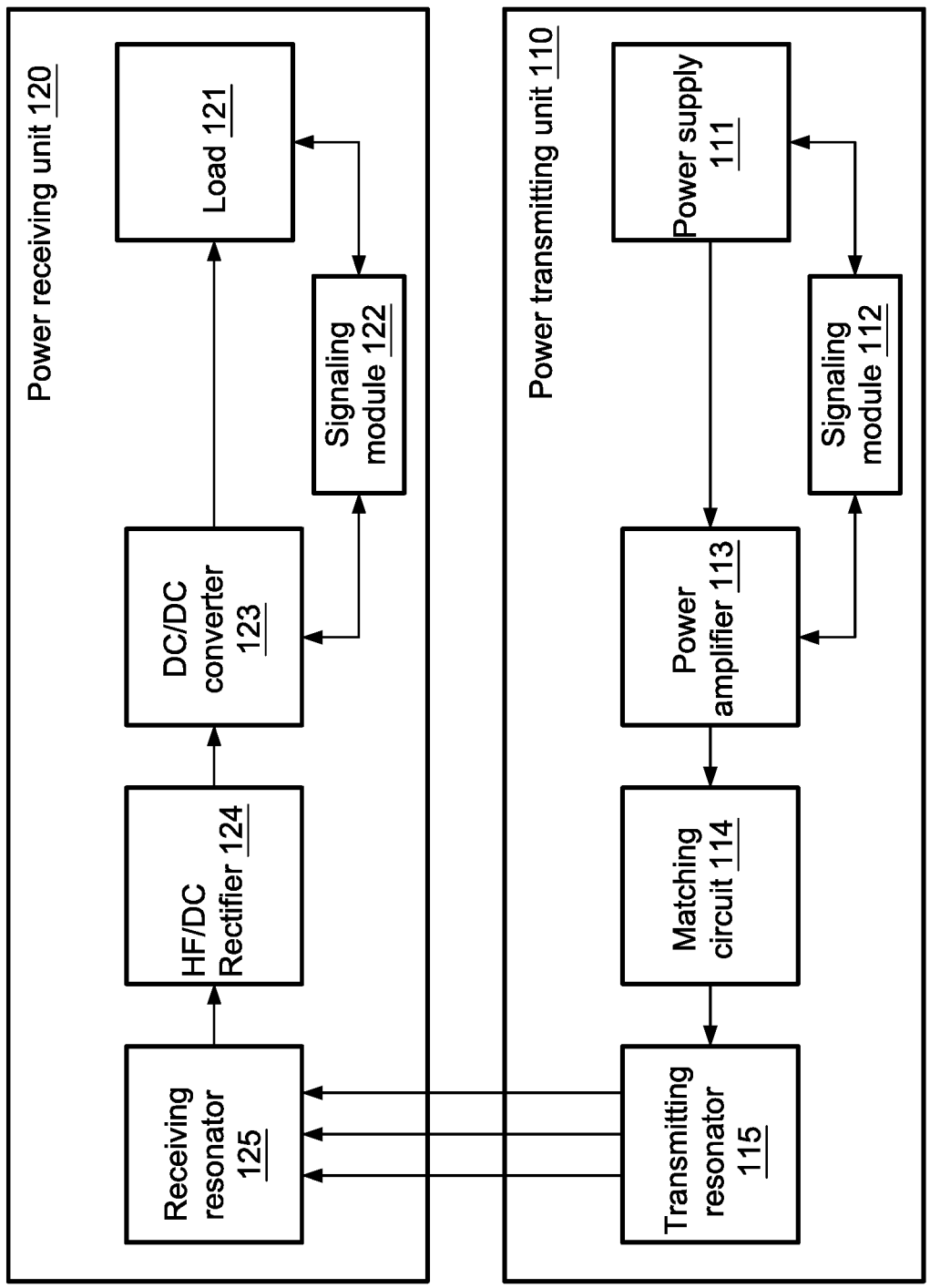
FIG. 1 is a block diagram of a wireless charging system according to some embodiments of the present disclosure.

The following disclosure provides many different embodiments or examples for implementing different features of the provided subject matter. Specific examples of components and arrangements are described below. Certainly, these descriptions are merely examples and are not intended to be limiting. In the present disclosure, in the following descriptions, the description of the first feature being formed on or above the second feature may include an embodiment formed by direct contact between the first feature and the second feature, and may further include an embodiment in which an additional feature may be formed between the first feature and the second feature to enable the first feature and the second feature to not be in direct contact. In addition, in the present disclosure, reference numerals and/or letters may be repeated in examples. This repetition is for the purpose of simplification and clarity, and does not indicate a relationship between the described various embodiments and/or configurations.

The embodiments of the present disclosure are described in detail below. However, it should be understood that many applicable concepts provided by the present disclosure may be implemented in a plurality of specific environments. The described specific embodiments are only illustrative and do not limit the scope of the present disclosure.

FIG. 1 is a block diagram of a wireless charging system 100 according to some embodiments of the present disclosure. The wireless charging system 100 includes a power transmitting unit 110 and a power receiving unit 120. The power transmitting unit 110 may include a wireless charge pad. The power receiving unit 120 may be disposed in a mobile phone, a smart watch, an electric car, or other electronic device(s).

The power transmitting unit 110 may include a power supply 111, a signaling module 112, a power amplifier 113, a matching circuit 114, and transmitting resonator 115. The power supply 111 may be coupled with the power amplifier 113 to provide power. The power amplifier 113 may be coupled with the matching circuit 114 to provide power. The matching circuit 114 may be coupled with the transmitting resonator 115 to provide power. The signaling module 112 may be in communication with the power supply 111 and the power amplifier 113 to send and receive signals.

The power supply 111 may provide AC power for charging. The power supply 111 may provide AC power to the AC (alternating current) power amplifier 113. The power amplifier 113 may convert the AC power from the power supply into relatively high frequency power, e.g., HF (high frequency) power. HF power may indicate the power having frequencies ranged from approximately tens of kilohertz to approximately several megahertz. For example, HF power may indicate the power having frequency of approximately 6.8 MHz or approximately 13.6 MHz. The signaling module 112 may receive signals indicating the configurations of the power supply 111 and the power amplifier 113. The signaling module 112 may send signals to modify the configurations of the power supply 111 and power amplifier 113. The HF power may be provided to the matching circuit 114. The matching circuit 114 may be used for impedance matching. After impedance matching, a minimum amount of HF power would be reflected backward and the power efficiency would be increased. The HF power may then be provided to a transmitting resonator 115. The transmitting resonator 115 may be a coil. The HF power may be transmitted through electromagnetic induction.

The power transmitting unit 120 may include a load 121, a signaling module 122, a DC (direct current)/DC converter 123, an HF/DC rectifier 124, and a receiving resonator 125. The receiving resonator 125 may receive power through electromagnetic induction. The HF/DC rectifier 124 may be coupled with the receiving resonator 125 to receive power. The DC/DC converter 123 may be coupled with the HF/DC rectifier 124 to receive power. The load 121 may be coupled with the DC/DC converter 123 to receive power. The signaling module 122 may be in communication with the load 121 and the DC/DC converter 123 to send and receive signals.

The receiving resonator 125 may be a coil matching with a transmitting resonator (e.g., the transmitting resonator 115 of the power transmitting unit 110). The receiving resonator 125 receives the power from the transmitting resonator 115 (e.g., through magnetic induction or magnetic resonance). The resonating coupling between the transmitting resonator 115 and the receiving resonator 125 may be about 6.78 MHz or other frequency.

The power received by the receiving resonator 125 may be provided to the HF/DC rectifier 124. The HF/DC rectifier 124 may rectify the received AC power and provide the rectified DC power. The rectified DC power may be provided to a DC/DC converter 123. The DC/DC converter 123 may convert the DC power into a suitable voltage for charging the load 121. The signaling module 122 may receive signals indicating the configurations of the load 121 and DC/DC converter 123. The signaling module 122 may send signals to modify the configurations of the load 121 and DC/DC converter 123.

Signaling modules 112 and 122 may be in communication with each other. The signaling modules 112 and 122 may be in communication through an unlicensed band communication (e.g., a 2.4 GHz communication technology, a 5 GHz communication technology, Bluetooth Low Energy technology, or an LTE-Unlicensed communication technology) or a licensed band communication (e.g., Narrowband Internet of Things technology, LTE-M technology, or 5G communication technology).

The signaling module 112 may be coupled to and in communication with the power supply 111 and the power amplifier 113. The signaling module 112 may configure the power amplifier 113 based on the configuration of the power supply 111. The signaling module 112 may configure the power amplifier 113 based on the configuration of the power supply 111. The signaling module 112 may send information about the power supply 111 and the power amplifier 113 to the signaling module 122. The signaling module 112 may receive information about load 121 and the DC/DC converter 123 from the signaling module 122. The signaling module 112 may configure the power supply 111 and the power amplifier 113 based on the information received from the signaling module 122.

The signaling module 122 may be coupled to and in communication with the load 121 and the DC/DC converter 123. The signaling module 122 may configure the DC/DC converter 123 based on the configuration of the load 121. The signaling module 122 may configure the DC/DC converter 123 based on the configuration of the load 121. The signaling module 122 may send information about load 121 and the DC/DC converter 123 to the signaling module 122. The signaling module 122 may receive information about the power supply 111 and the power amplifier 113 from the signaling module 112. The signaling module 122 may configure the load 121 and the DC/DC converter 123 based on the information received from the signaling module 112.

Figure 2:
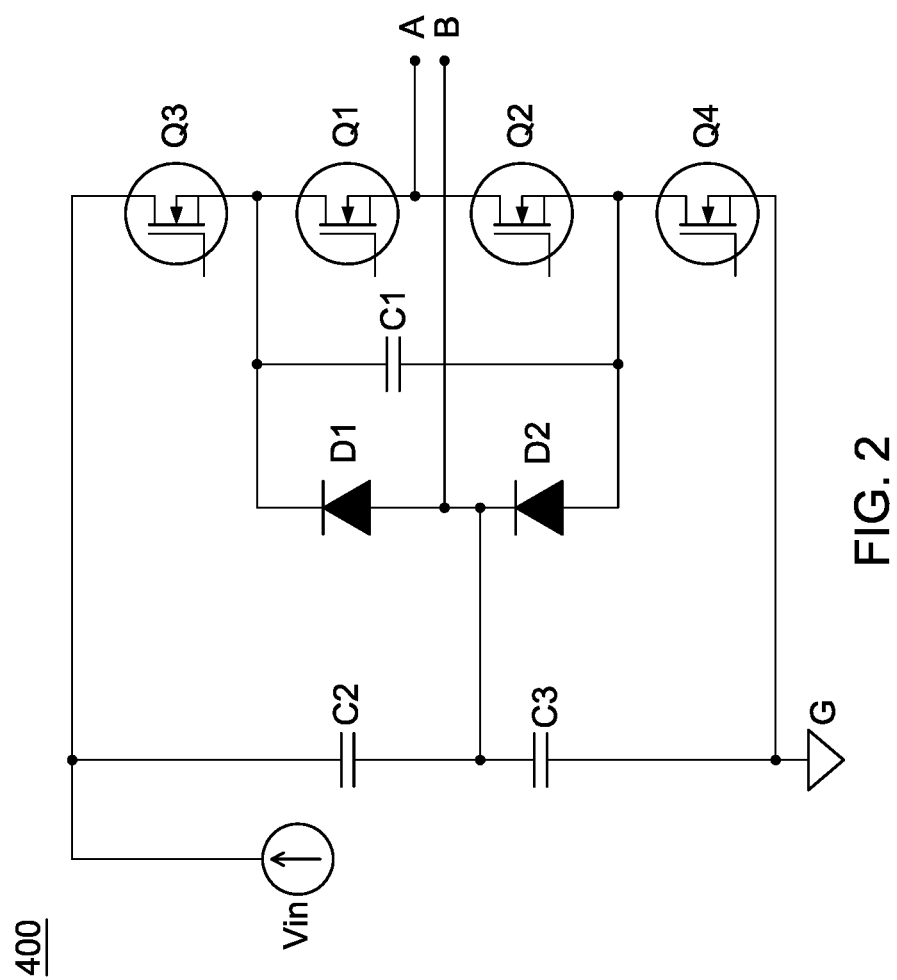
FIG. 2 is a schematic circuit diagram of an amplifier according to some embodiments of the present disclosure.

FIG. 2 is a schematic circuit diagram of an amplifier 400 according to some embodiments of the present disclosure. The amplifier 400 may be used as the power amplifier 113 shown in FIG. 1. The amplifier 400 includes transistors Q1, Q2, Q3 and Q4. Each of the transistors Q1, Q2, Q3, and Q4 of the amplifier 400 may include a NMOS, a PMOS, or an HEMT (high electron mobility transistor).

The transistors Q1-Q4 may be formed of or include a direct bandgap material, such as an III-V compound, which includes, but is not limited to, for example, GaAs, InP, GaN, InGaAs and AlGaAs. The transistors Q1-Q4 may be GaN-based transistors. The transistors Q1-Q4 may include a high-electron-mobility transistor (HEMT).

The transistors Q1-Q4 may be power devices (e.g., power transistors) or a part of a power device. For example, the transistors Q1-Q4 may be configured to conduct a relatively large amount of current (e.g., hundreds of milliamps or more) compared with general transistors. For example, the transistors Q1-Q4 may have a relatively large breakdown voltage (e.g., hundreds of volts or more) compared with a general transistor.

The drain of the transistor Q1 may be coupled with the source of transistor Q3. The drain of the transistor Q1 may be coupled with the capacitor C1. The drain of the transistor Q1 may be coupled with the cathode of the capacitor C1. The source of the transistor Q1 may be coupled with the drain of the transistor Q2.

The drain of the transistor Q2 may be coupled with the source of the transistor Q1. The source of the transistor Q2 may be coupled with the anode of diode D2. The source of the transistor Q2 may be coupled with the drain of transistor Q4. The source of the transistor Q2 may be coupled with the capacitor C1.

The drain of the transistor Q3 may be coupled with the input voltage. The drain of the transistor Q3 may be coupled with the capacitor C2. The source of the transistor Q3 may be coupled with the drain of the transistor Q1. The source of the transistor Q3 may be coupled with the capacitor C1. The source of the transistor Q3 may be coupled with the cathode of the diode D1.

The drain of the transistor Q4 may be coupled with the source of the transistor Q2. The drain of the transistor Q4 may be coupled with the capacitor C1. The drain of the transistor Q4 may be coupled with the anode of the diode D2. The source of the transistor Q4 may be coupled with the ground G. The source of the transistor Q4 may be coupled with the capacitor C3.

The transistors Q1 and Q2 may be coupled with each other in serial. The transistors Q3 and Q1 may be coupled in serial. The transistors Q2 and Q4 may be coupled in serial. The transistors Q3, Q1, Q2 and Q4 may be coupled in serial.

The amplifier 400 includes capacitors C1, C2, and C3. The amplifier includes diodes D1 and D2. The amplifier 400 includes input voltage Vin and ground G. The amplifier 400 includes nodes A and B. The node A is between the transistors Q1 and Q2. The node A may be between the source of the transistor Q1 and the drain of the transistor Q2. The node B is between the diodes D1 and D2. The node B is also between the capacitors C2 and C3.

The cathode of the diode D1 may be coupled with the drain of the transistor Q1. The cathode of the diode D1 may be coupled with the capacitor C1. The cathode of the diode D1 may be coupled with the source of the transistor Q3. The anode of the diode D1 may be coupled with the cathode of the diode D2. The anode of the diode D1 may be coupled with the capacitor C2. The anode of the diode D1 may be coupled with the capacitor C3.

The cathode of the diode D2 may be coupled with the capacitor C2. The cathode of the diode D2 may be coupled with the capacitor C3. The anode of the diode D2 may be coupled with the capacitor C1. The anode of the diode D2 may be coupled with the source of the transistor Q2. The anode of the diode D2 may be coupled with the drain of the transistor Q4. The capacitor C2 may be coupled between the drain of the transistor Q3 and the anode of the diode D1. The capacitor C2 may be coupled between the input voltage Vin and the anode of the diode D1.

The capacitor C3 may be coupled between the cathode of the diode D2 and the source of the transistor Q4. The capacitor C3 may be coupled between the cathode of the diode D2 and the ground G. The capacitor C3 may be coupled to the diode D2 in parallel.

In FIG. 2, the capacitors C2 and C3 may be used as voltage-dividing capacitors. The input voltage Vin is divided by the capacitors C2 and C3. The input voltage Vin is equally divided by the capacitors C2 and C3, and the voltage across each of the capacitors C2 and C3 may be half of the input voltage (i.e., Vin/2). The voltage of each of the capacitors C2 and C3 may be smaller than half of the input voltage (i.e., Vin/2).

The transistors Q1 and Q2 may be complementarily conducted. The transistors Q1 and Q2 may be alternatively conducted. The transistors Q3 and Q4 may be complementarily conducted. The transistors Q3 and Q4 may be alternatively conducted. The diodes D1 and D2 may be used as clamping diodes. The diodes D1 and D2 are clamping diodes and ensure that the voltage stress (i.e., the maximum voltage $V_{DS}$) over each of the transistors Q1, Q2, Q3, and Q4 is not greater than half of the input voltage (i.e., Vin/2), so as to prevent the transistors Q1, Q2, Q3, and Q4 from burning out.

The capacitor C1 is a flying capacitor. When the amplifier 400 is operated at a steady state, the voltage of the capacitor C1 may be half of the input voltage (i.e., Vin/2). When the transistors Q1, Q2, Q3, and Q4 are switching, the switching processes of the transistors Q1 and Q2 may be decoupled with the switching processes of the transistors Q3 and Q4 by the capacitor C1. When the transistors Q1 and Q2 are switching, the junction capacitance of the transistors Q3 and Q4 is not involved. When the transistors Q3 and Q4 are switching, the junction capacitance of the transistors Q1 and Q2 is not involved.

During operations of the amplifier 400, the maximum voltage $V_{DS}$ may equal to half of the input voltage (i.e., Vin/2). During operations of the amplifier 400, the maximum voltage $V_{DS}$ may be smaller than half of the input voltage (i.e., Vin/2). During operations of the amplifier 400, the voltage $V_{DS}$ may be smaller than half of the input voltage (i.e., Vin/2). In a wireless charging system for electric cars, the input voltage Vin may be approximately 250 volts, and the maximum voltage $V_{DS}$ of the transistors Q1, Q2, Q3, and Q4 may be approximately 125 volts. Therefore, while designing a wireless charging system for electric cars, the breakdown threshold of voltage $V_{DS}$ of the transistor used in the amplifier 400 may be relatively low. For example, the breakdown threshold of voltage $V_{DS}$ of the transistor used in the amplifier 400 may be half. If a transistor has a high breakdown threshold of voltage $V_{DS}$, the transistor may cost much or may have a large volume. If an amplifier may use a transistor having a relatively lower breakdown threshold of voltage $V_{DS}$, the cost or volume of the amplifier may be decreased. On the other hand, since the breakdown threshold of voltage $V_{DS}$ is not critical, the range of input voltage of the amplifier is relatively broad.

Figure 3:
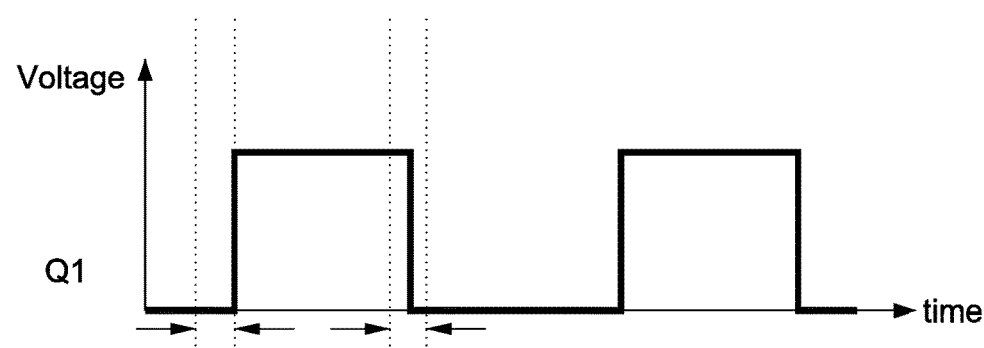
FIG. 3 illustrates a waveform of voltage of an amplifier according to some embodiments of the present disclosure.

FIG. 3 illustrates a waveform of voltage of the amplifier 400 according to some embodiments of the present disclosure. The X-axis of the waveform in FIG. 3 represents time. The Y-axis of the waveform in FIG. 3 represents voltage. FIG. 3 illustrates the waveform of voltage fed to the transistor Q1. In particular, FIG. 3 illustrates the waveform of voltage fed to the gate of the transistor Q1.

Figure 4:
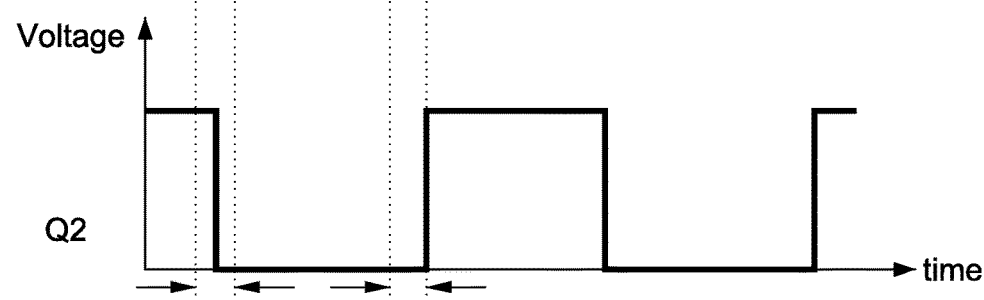
FIG. 4 illustrates a waveform of voltage of an amplifier according to some embodiments of the present disclosure.

FIG. 4 illustrates a waveform of voltage of the amplifier 400 according to some embodiments of the present disclosure. The X-axis of the waveform in FIG. 4 represents time. The Y-axis of the waveform in FIG. 4 represents voltage. FIG. 4 illustrates the waveform of voltage fed to the transistor Q2. In particular, FIG. 4 illustrates the waveform of voltage fed to the gate of the transistor Q2. There may be a phase difference of approximately 180 degrees between the waveforms in FIGS. 3 and 4. When the waveforms in FIGS.

3 and 4 are fed to the gates of transistors Q1 and Q2, respectively, the transistors Q1 and Q2 are conducted alternatively or complementarily.

Figure 5:
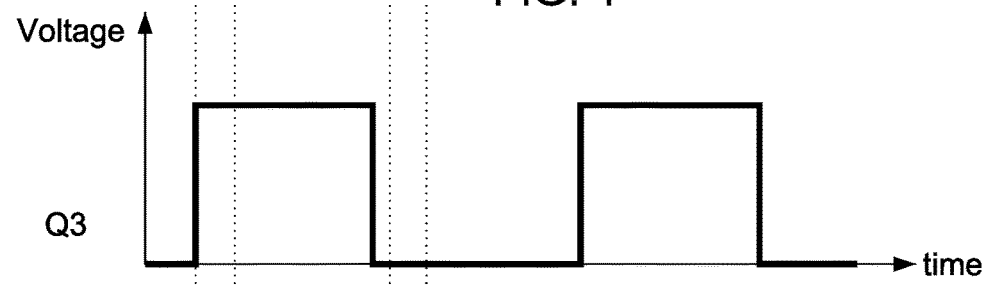
FIG. 5 illustrates a waveform of voltage of an amplifier according to some embodiments of the present disclosure.

FIG. 5 illustrates a waveform of voltage of the amplifier 400 according to some embodiments of the present disclosure. The X-axis of the waveform in FIG. 5 represents time. The Y-axis of the waveform in FIG. 5 represents voltage. FIG. 5 illustrates the waveform of voltage fed to the transistor Q3. In particular, FIG. 5 illustrates the waveform of voltage fed to the gate of the transistor Q3.

Figure 6:
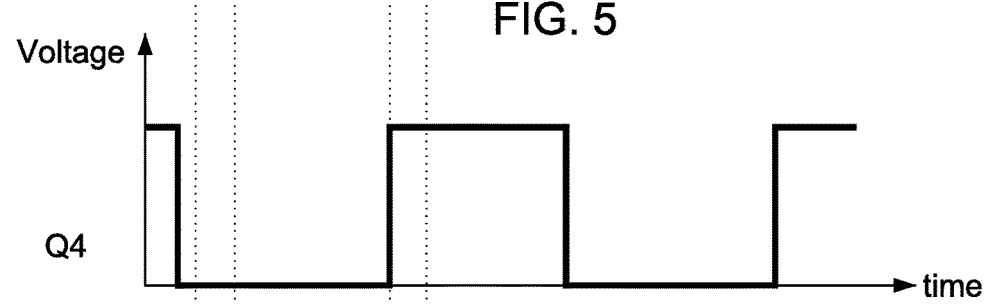
FIG. 6 illustrates a waveform of voltage of an amplifier according to some embodiments of the present disclosure.

FIG. 6 illustrates a waveform of voltage of the amplifier 400 according to some embodiments of the present disclosure. The X-axis of the waveform in FIG. 6 represents time. The Y-axis of the waveform in FIG. 6 represents voltage. FIG. 6 illustrates the waveform of voltage fed to the transistor Q4. In particular, FIG. 6 illustrates the waveform of voltage fed to the gate of the transistor Q4. There may be a phase difference of approximately 180 degrees between the waveforms in FIGS. 5 and 6. When the waveforms in FIGS. 5 and 6 are fed to the gates of transistors Q3 and Q4, respectively, the transistors Q3 and Q4 are conducted alternatively or complementarily.

Figure 7:
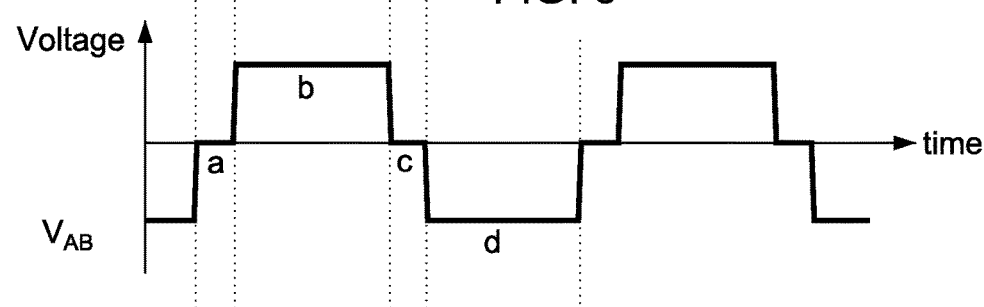
FIG. 7 illustrates a waveform of voltage of an amplifier according to some embodiments of the present disclosure.

FIG. 7 illustrates a waveform of the amplifier 400 according to some embodiments of the present disclosure. The X-axis of the waveform in FIG. 7 represents time. The Y-axis of the waveform in FIG. 7 represents voltage. FIG. 7 illustrates the waveform of voltage (or the waveform of electric potential) across nodes A and B shown in FIG. 2. As shown in FIG. 7, voltage $V_{AB}$ may include positive voltage and negative voltage. As shown in FIG. 7, voltage $V_{AB}$ may include alternating positive portions and negative portions.

The Y-axes in FIGS. 3-7 may be aligned. The wave of voltage may include segments a, b, c, and d. Corresponding to segment a, transistors Q2 and Q3 are conducted. When the transistor Q2 is conducted, it may contribute negative voltage of voltage $V_{AB}$. When the transistor Q3 is conducted, it may contribute positive voltage of voltage $V_{AB}$. As a result of transistors Q2 and Q3 being conducted, the corresponding segment a of voltage $V_{AB}$ may be zero.

Corresponding to segment b, transistors Q1 and Q3 are conducted. When the transistor Q1 is conducted, it may contribute positive voltage of voltage $V_{AB}$. When the transistor Q3 is conducted, it may contribute positive voltage of voltage $V_{AB}$. As a result of transistors Q1 and Q3 being conducted, the corresponding segment a of voltage $V_{AB}$ is positive.

Corresponding to segment c, transistors Q1 and Q4 are conducted. When the transistor Q1 is conducted, it may contribute positive voltage of voltage $V_{AB}$. When the transistor Q4 is conducted, it may contribute negative voltage of voltage $V_{AB}$. As a result of transistors Q1 and Q4 being conducted, the corresponding segment a of voltage $V_{AB}$ may be zero.

Corresponding to segment d, transistors Q2 and Q4 are conducted. When the transistor Q2 is conducted, it may contribute negative voltage of voltage $V_{AB}$. When the transistor Q4 is conducted, it may contribute negative voltage of voltage $V_{AB}$. As a result of transistors Q2 and Q4 being conducted, the corresponding segment a of voltage $V_{AB}$ may be negative.

Due to the phase difference between the waveforms in FIGS. 3 and 5, the transistor Q3 may be conducted before the transistor Q1. The transistor Q1 may be conducted after the transistor Q3. Due to the phase difference between waveforms in FIGS. 4 and 6, the transistor Q4 may be conducted before the transistor Q2. The transistor Q2 may be conducted after the transistor Q4. The transistors Q3 and Q4 may be the leading transistors. The transistors Q1 and Q2 may be the lagging transistors.

There may be an offset $\Phi$ between the waveforms fed to the transistors Q1 and Q3 (i.e., waveforms in FIGS. 3 and 5). There may be an offset $\Phi$ between the conductions of the transistors Q1 and Q3. There may be a phase difference $\Phi$ between the conduction angles of the transistors Q1 and Q3. The phase offset angle $\Phi$ may be between the conductions of the transistors Q1 and Q3. There may be an offset $\Phi$ between the waveforms fed to the transistors Q2 and Q4 (i.e., waveforms in FIGS. 4 and 6). There may be an offset $\Phi$ between the conductions of the transistors Q2 and Q4. There may be a phase difference $\Phi$ between the conduction angles of the transistors Q2 and Q4. The phase offset angle $\Phi$ may be between the conductions of the transistors Q2 and Q4. The phase offset angle $\Phi$ may be smaller than approximately 90 degrees.

Figure 8:
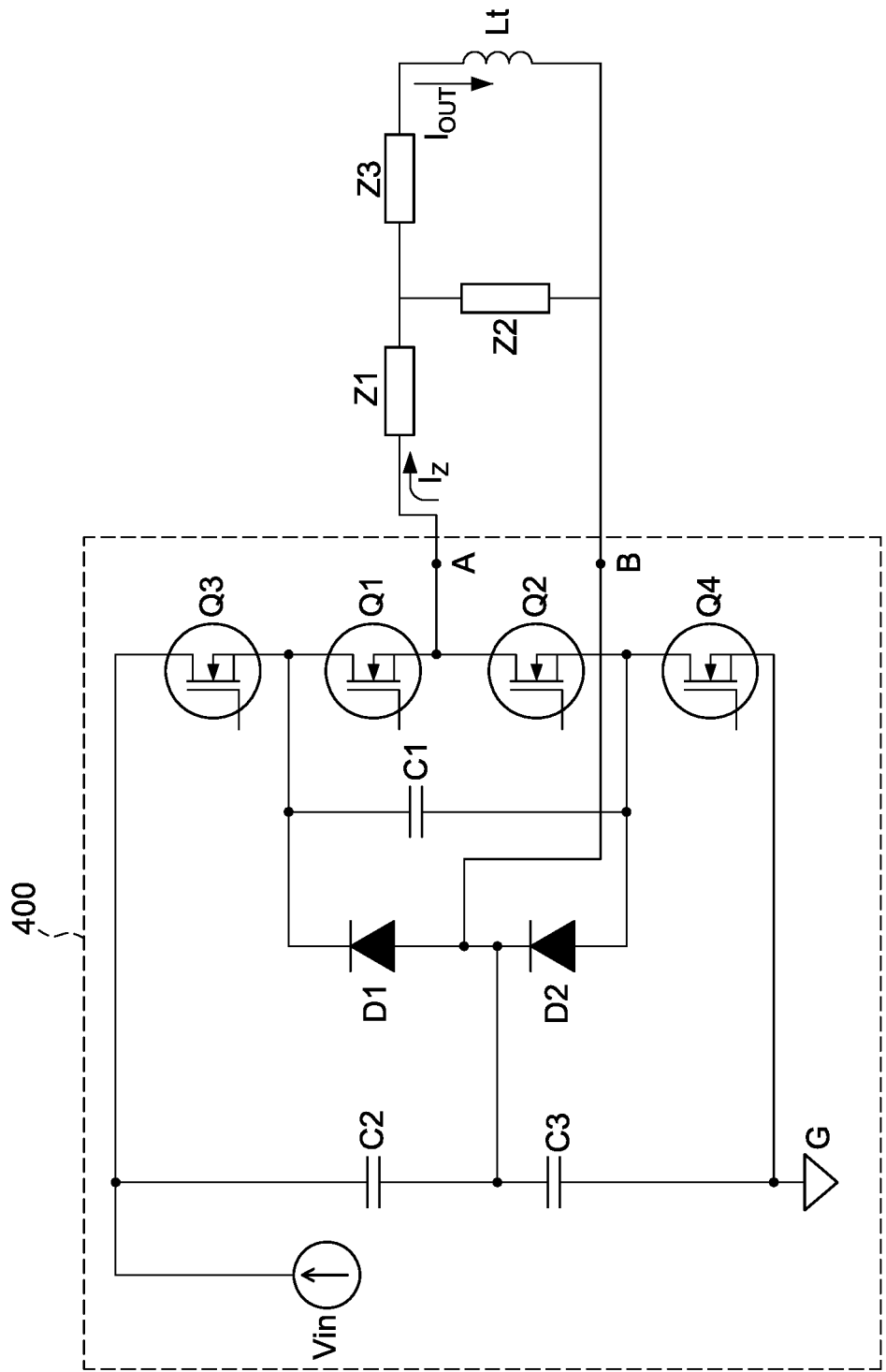
FIG. 8 is a schematic circuit diagram of an amplifier, impedances, and a coil according to some embodiments of the present disclosure.

The waveform of voltage $V_{AB}$ in FIG. 7 may be adjusted by adjusting the phase offset angle $\Phi$, and the transmitting current $I_{OUT}$ (as shown in FIG. 8) and the transmitting power of the amplifier 400 may be adjusted accordingly. If the input voltage is varied within a wide range, the pulse width of the waveform of voltage $V_{AB}$ may be adjusted through adjusting the phase offset angle $\Phi$, and the transmitting current $I_{OUT}$ (as shown in FIG. 8) and the transmitting power may be controlled accordingly.

The waveform in FIG. 7 is more similar to a sine wave due to the phase offset angle $\Phi$. Thus, the waveform in FIG. 7 has less second harmonic than the waveform in FIG. 5.

FIG. 8 is a schematic circuit diagram of the amplifier 400 coupled to impedances Z1, Z2, Z3 and a coil Lt according to some embodiments of the present disclosure. The amplifier 400 may be used as the power amplifier 113 shown in FIG. 1. The combination of the impedances Z1, Z2, and Z3 may be used as the matching circuit 114 shown in FIG. 1. The coil Lt may be used as the transmitting resonator 115 shown in FIG. 1. Current $I_Z$ may indicate the current flows through the impedance Z1. Current $I_{OUT}$ may indicate the current flows through the coil Lt. The current $I_{OUT}$ may determine the power transmitted from the coil Lt. The coil Lt may include a corresponding impedance Zt.

An impedance circuit may include the impedances Z1, Z2, Z3. The combination of the impedance circuit and the coil Lt may be coupled with the nodes A and B of the amplifier 400. The combination of the impedance circuit and the coil Lt may be coupled between the anode of the diode D1 and the source of the transistor Q1. The combination of the impedance circuit and the coil Lt may be coupled between the cathode of the diode D2 and the drain of the transistor Q2.

Figure 9:
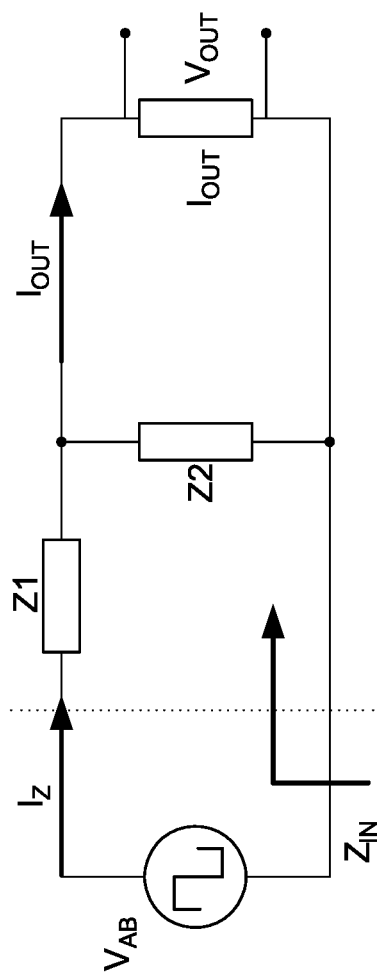
FIG. 9 is a schematic circuit diagram according to some embodiments of the present disclosure.

FIG. 9 illustrates an equivalent circuit of the circuit as described and illustrated with reference to FIG. 8 according to some embodiments of the present disclosure. Voltage $V_{AB}$ in FIG. 9 may correspond to voltage $V_{AB}$ in FIG. 8. The impedance Z1 in FIG. 9 may correspond to the impedance Z1 in FIG. 8. The impedance Z2 in FIG. 9 may correspond to the impedance Z2 in FIG. 8. $Z_{IN}$ may indicate the equivalent input impedance with respect to voltage $V_{AB}$. The current $I_Z$ in FIG. 9 may correspond to the current $I_Z$ in FIG. 8. The current $I_{OUT}$ in FIG. 9 may correspond to the current $I_{OUT}$ in FIG. 8. The output voltage $V_{OUT}$ may be a potential difference across the impedance $Z_{OUT}$. The impedance $Z_{OUT}$ may be the combination of the impedance Z3 and the impedance of the coil Lt, which are coupled in series. For example, $Z_{OUT}=Z3+Zt$, where the impedance Zt indicates a corresponding impedance of the coil Lt.

From the circuit of FIG. 9, the output voltage $V_{OUT}$ may be represented as:

$$V_{OUT} = \frac{Z2 \times Z_{OUT} \times V_{AB}}{[Z_{OUT} \times (Z1 + Z2)] + (Z1 \times Z2)} \quad (1)$$

When Z1+Z2=0, the output voltage $V_{OUT}$ may be represented as:

$$V_{OUT} = \frac{Z_{OUT} \times V_{AB}}{Z1} \quad (2)$$

According to Ohm's law, the output current $I_{OUT}$ may be represented as:

$$I_{OUT} = \frac{V_{OUT}}{Z_{OUT}} \quad (3)$$

Thus, when Z1+Z2=0, based on equations (2) and (3), the output current $I_{OUT}$ may be represented as:

$$I_{OUT} = \frac{V_{AB}}{Z1} \quad (4)$$

When Z1+Z2=0, according to equation (4), the output current $I_{OUT}$ may be a ratio of voltage $V_{AB}$ to impedance Z1. The output current $I_{OUT}$ may be controlled by controlling voltage $V_{AB}$.

The impedance Z3 may be an impedance of a compensation network. A proper impedance Z3 may be selected to ensure the input impedance $$Z_{in} = \frac{Z1 \times Z2}{Z2 + Z_{out}},$$

in which $Z_{out}$=Z3+$Z_t$, and the input impedance $Z_{IN}$ may represent a characteristic of inductive reactance.

Due to the inductance of $Z_{IN}$, the phase of $I_Z$ is lagging behind the phase of voltage $V_{AB}$, and it is helpful to implement zero voltage switching of the transistors Q1 to Q4.

FIG. 10 illustrates a waveform of voltage of the amplifier 400 according to some embodiments of the present disclosure. In particular, FIG. 10 illustrates a waveform of voltage of the amplifier 400 coupled with the impedances Z1, Z2, Z3 and the coil Lt in FIG. 8 according to some embodiments of the present disclosure. The X-axis of the waveform in FIG. 10 represents time. The Y-axis of the waveform in FIG. 10 represents voltage.

The waveform in FIG. 10 may be identical to the waveform in FIG. 7. FIG. 10 illustrates the waveform of voltage (or the waveform of electric potential) between nodes A and B shown in FIG. 8. As shown in FIG. 10, the waveform of voltage $V_{AB}$ may include positive and negative voltages. As shown in FIG. 10, the waveform of voltage $V_{AB}$ may include alternating positive portions and negative portions. As shown in FIG. 10, the waveform of voltage $V_{AB}$ may be analog to a sine wave.

FIG. 11 illustrates a waveform of current of the amplifier 400 according to some embodiments of the present disclosure. In particular, FIG. 11 shows a waveform of the amplifier 400 coupled with the impedances Z1, Z2, Z3 and the coil Lt in FIG. 8. The X-axis of the waveform in FIG. 11 represents time. The Y-axis of the waveform in FIG. 11 represents the current. FIG. 11 illustrates the waveform of the current $I_Z$ flowing through the impedance Z1 shown in FIG. 8. As shown in FIG. 11, the current $I_Z$ may be analog to a sine wave. The Y-axes in FIGS. 10 and 11 may be aligned. The current $I_Z$ may be associated with the voltage $V_{AB}$.

Figure 12:
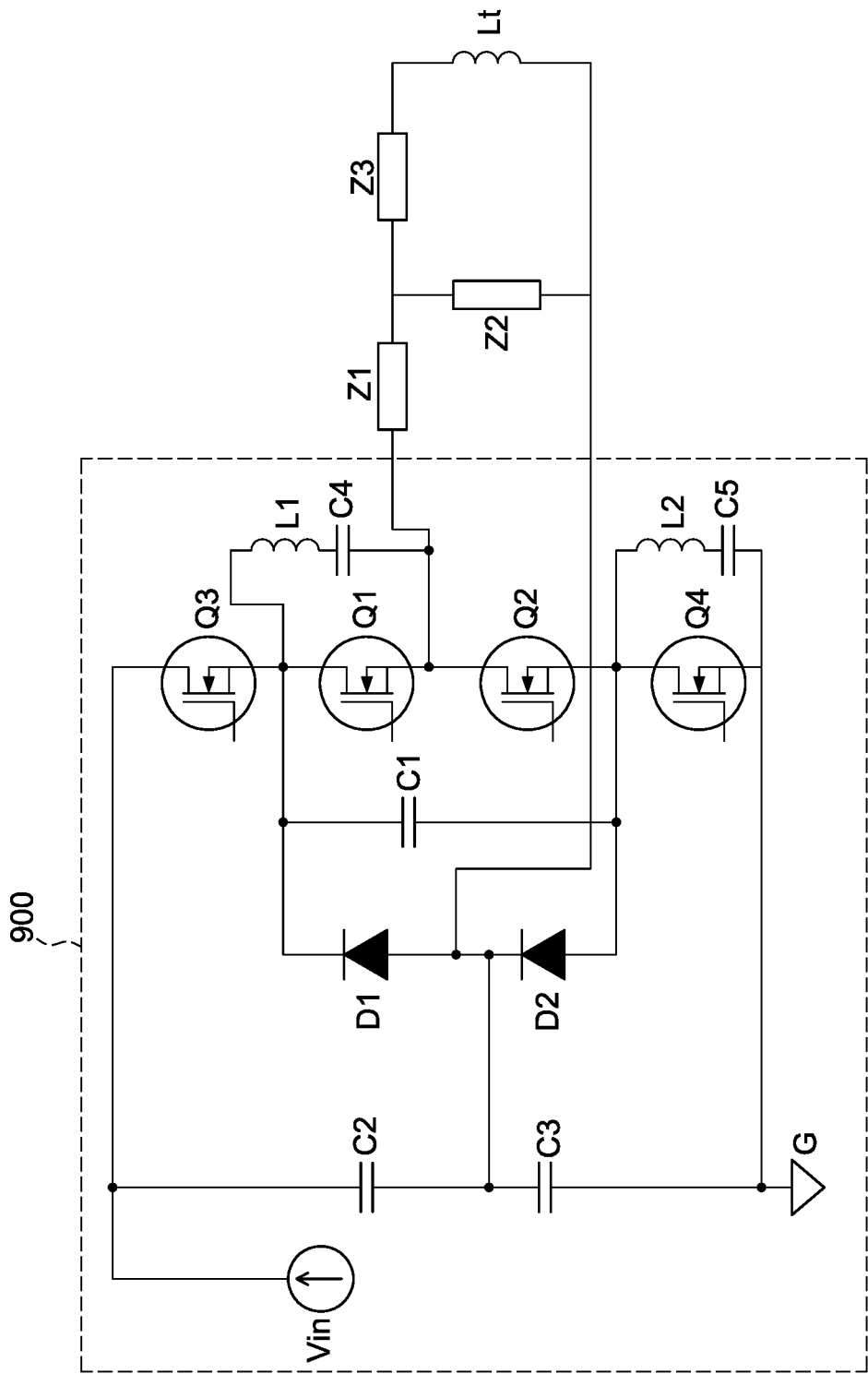
FIG. 12 is a schematic circuit diagram of an amplifier, impedances, and a coil according to some embodiments of the present disclosure.

FIG. 12 is a schematic circuit diagram of an amplifier 900 coupled with the impedances Z1 to Z3 and a coil Lt according to some embodiments of the present disclosure. The amplifier 900 may be used as the power amplifier 113 shown in FIG. 1. The combination of the impedances Z1, Z2, and Z3 may be used as the matching circuit 114 shown in FIG. 1. The coil Lt may be used as the transmitting resonator 115 shown in FIG. 1.

Based on the circuit diagram shown in FIG. 8, the circuit diagram shown in FIG. 12 further includes the inductors L1 and L2 and the capacitor C4 and C5. Based on the amplifier 400 shown in FIG. 8, the amplifier 900 in FIG. 12 further includes the inductors L1 and L2 and the capacitor C4 and C5. Based on the amplifier 400 shown in FIG. 6, the amplifier 900 in FIG. 4 further includes two zero voltage switching (ZVS) circuits.

The inductor L1 and the capacitor C4 may be coupled in series and then coupled with the transistor Q1 in parallel. The inductor L1 and the capacitor C4 in series may be coupled between the drain of the transistor Q1 and the source of the transistor Q1.

The inductor L2 and the capacitor C5 may be coupled in series and then coupled with the transistor Q4 in parallel. The inductor L2 and the capacitor C5 in series may be coupled between the drain of the transistor Q4 and the source of the transistor Q4.

With the ZVS circuits, the switching loss of the amplifier 900 may be decreased, and the performance of the amplifier 900 may be increased. Additionally, the EMI (electromagnetic Interference) of the amplifier 900 may be improved, the switching frequency of the amplifier 900 may be increased, and the inductance and capacitance of the amplifier 900 may be decreased.

One of the schematic circuit diagrams of the present disclosure may be entirely or partly implemented as a semiconductor device. For example, the amplifier 900, the impedances Z1 to Z3, and the coil Lt shown in FIG. 12 may be implemented as a semiconductor device. Or, the amplifier 900 may be implemented as a semiconductor device. The amplifier 400, the impedances Z1 to Z3, and the coil Lt shown in FIG. 8 may be implemented as a semiconductor device. The amplifier 400 may be implemented as a semiconductor device.

Figure 13:
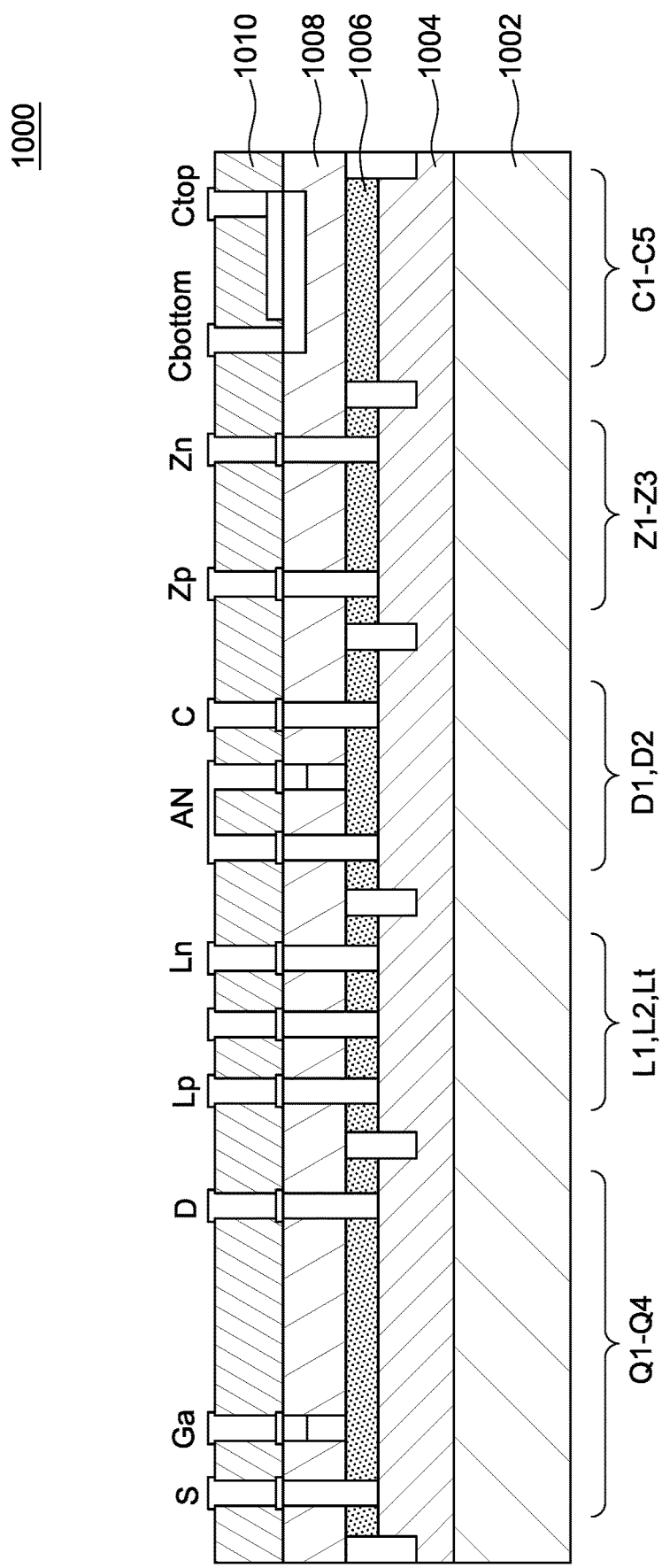
FIG. 13 is a cross-sectional view of a semiconductor device according to another embodiment of the present disclosure.

FIG. 13 is a cross-sectional view of a semiconductor device 1000 according to some embodiments of the present disclosure. The amplifier 900, the impedances Z1 to Z3, and the coil Lt shown in FIG. 12 may be implemented as the semiconductor device 1000. The power amplifier 113, the matching circuit 114, and the transmitting resonator 115 shown in FIG. 1 may be implemented as the semiconductor device 1000. The amplifier 400, the impedances Z1 to Z3, and the coil Lt shown in FIG. 8 may be implemented as a semiconductor device similar to the semiconductor device 1000. The amplifier 400 may be implemented as a semiconductor device similar to the semiconductor device 1000.

The semiconductor device 1000 of FIG. 13 includes a substrate 1002, semiconductor layers 1004 and 1006, and passivation layers 1008 and 1010. The gallium nitride (GaN) transverses high-electron-mobility transistors Q1 to Q4 and may be formed on the substrate 1002. The substrate 1002 may include, for example, but is not limited to, silicon (Si), doped Si, silicon carbide (SiC), germanium silicide (SiGe), gallium arsenide (GaAs), or other semiconductor materials. The substrate 1002 may also include, for example, but is not limited to, sapphire, silicon on insulator (SOI) or other suitable materials. The substrate 1002 may further include a doped region (not marked in FIG. 13), such as p-well and n-well.

The semiconductor layer 1004 may include a III-V material. The semiconductor layer 1004 may include, but is not limited to, III nitrides, such as, but not limited to, GaN, AlN, InN and a compound $In_xAl_yGa_{1-x-y}N$ where x+y is less than or equal to 1, or a compound $Al_yGa_{(1-y)}N$ where y is less than or equal to 1.

The semiconductor layer 106 may include a III-V material with a bandgap greater than that of the semiconductor layer 1004. The semiconductor layer 1006 may include, but is not limited to, III nitrides, such as, but not limited to, GaN, AlN, InN and a compound $In_xAl_yGa_{1-x-y}N$ where x+y is less than or equal to 1, or a compound $Al_yGa_{(1-y)}N$ where y is less than or equal to 1. The semiconductor layers 1004 and 1006 may form heterojunctions. The polarization of the heterojunctions of different nitrides may form two-dimensional electron gas (2DEG) (not marked in FIG. 13) on interfaces of the semiconductor layers 1004 and 1006.

The passivation layers 1008 and 1010 may include dielectric materials. For example, the passivation layers 1008 and 1010 may include, but are not limited to, silicon nitride ($SiN_x$), silicon dioxide ($SiO_2$), $Al_2O_3$, or $HfO_2$.

The GaN transistors Q1 to Q4 in FIG. 13 may include a gate structure Ga, a drain structure D and a source structure S arranged on the semiconductor layer 1006. The GaN transistors Q1 to Q4 in FIG. 13 may be turned on or turned off according to changes of an input signal of a gate thereof. The cross-sectional view of FIG. 13 may only illustrate one of the transistors Q1 to Q4. This is because the transistors Q1 to Q4 may be arranged into one column on the semiconductor device 1000 in the present disclosure.

The semiconductor device 1000 of FIG. 13 is also provided with the inductors L1, L2, and Lt arranged on the semiconductor layer 1006, and the diodes D1 and D2 arranged on the semiconductor layer 1006. Each of inductors L1, L2, and Lt may include terminals Lp and Ln. Each of diodes D1 and D2 may include an anode AN and a cathode C. The cross-sectional view of FIG. 13 may only illustrate one of the inductors L1, L2, and Lt. This is because the inductors L1, L2, and Lt may be arranged into one column on the semiconductor device 1000 in the present disclosure. In addition, the inductors L1, L2, and Lt may be arranged near to the transistors Q1 to Q4 or near to the diodes D1 and D2.

The cross-sectional view of FIG. 13 may only illustrate one of the diodes D1 and D2. This is because the diodes D1 and D2 may be arranged into one column on the semiconductor device 1000 in the present disclosure. In addition, the diodes D1 and D2 may be arranged near to the transistors Q1 to Q4 or near to the diodes D1 and D2.

The semiconductor device 1000 of FIG. 13 may further include impedances Z1 to Z3. Each of the impedances Z1 to Z3 may include two terminals Zp and Zn. The impedances Z1 to Z3 may be arranged on the semiconductor layer 1006, and are close to the transistors Q1 to Q4, or close to the inductors L1, L2, and Lt. The side view of FIG. 13 may only illustrate one of the impedances Z1 to Z3. This is because the impedances Z1 to Z3 may be arranged into one column on the semiconductor device 1000 in the present disclosure.

The semiconductor device 1000 of FIG. 13 may further include capacitors C1 to C5. Each of the capacitors C1 to C5 may include two terminals Ctop and Cbottom. The capacitors C1 to C5 may be arranged on the semiconductor layer 1006, and are close to the impedances Z1 to Z3, close to the diodes D1 and D2, or close to the inductors L1, L2, and Lt. The side view of FIG. 13 may only illustrate one of the capacitors C1 to C5. This is because the capacitors C1 to C5 may be arranged into one column on the semiconductor device 1000 in the present disclosure.

One of the schematic circuit diagrams of the present disclosure may be entirely or partly implemented as an integrated circuit. For example, the amplifier 900, the impedances Z1 to Z3, and the coil Lt shown in FIG. 12 may be implemented as an integrated circuit. The amplifier 900 may be implemented as an integrated circuit. The amplifier 400, the impedances Z1 to Z3, and the coil Lt shown in FIG. 8 may be implemented as an integrated circuit. The amplifier 400 may be implemented as an integrated circuit.

One of the schematic circuit diagrams of the present disclosure may be entirely or partly implemented as a circuit board. For example, the amplifier 900, the impedances Z1 to Z3, and the coil Lt shown in FIG. 12 may be implemented as a circuit board. The amplifier 900 may be implemented as a circuit board. The amplifier 400, the impedances Z1 to Z3, and the coil Lt shown in FIG. 8 may be implemented as a circuit board. The amplifier 400 may be implemented as an integrated circuit.

FIG. 14 is a schematic circuit diagram of an amplifier 1100 according to some embodiments of the present disclosure. The amplifier 1100 may be used as the power amplifier 113 shown in FIG. 1. The amplifier 1100 may include a class-E amplifier. The amplifier 1100 may include an input voltage 1101 that provides the voltage $V_{DD}$, the ground 1104, a transistor 1103, inductors 1102 and 1106, capacitors 1105 and 1107 and a load 1108.

FIG. 15 illustrates a waveform of voltage of the amplifier 1100 according to some embodiments of the present disclosure, where the X-axis represents time and the Y-axis represent voltage. FIG. 15 illustrates the waveform of voltage $V_{DS}$, where the voltage $V_{DS}$ indicates the voltage difference (or electric potential difference) between the drain and the source of the transistor 1103.

FIG. 16 illustrates a waveform of current of the amplifier 1100 according to some embodiments of the present disclosure, where the X-axis represents time and the Y-axis represent current. FIG. 16 illustrates the waveform of current $I_D$, where the current $I_D$ indicates the current flows through the load 1108.

The Y-axes in FIGS. 15 and 16 may be aligned. The waveforms in FIGS. 15 and 16 both show a duty cycle of the amplifier 1100. At the half of the duty cycle (e.g., the position marked with "50%"), both voltage $V_{DS}$ and current $I_D$ are zero. At the end of the duty cycle, the magnitude of current $I_D$ drops to zero.

FIG. 15 shows that the maximum voltage $V_{DS}$ is equal to approximately 3.56 times of voltage $V_{DD}$. In a class-E amplifier, the voltage stress of the switching element (i.e., voltage $V_{DS}$ of a transistor) may be approximately 3 times to approximately 4 times of the input voltage (i.e., $V_{DD}$ in FIG. 7A). In a wireless charging system for electric cars, the input voltage (i.e., $V_{DD}$) 1101 of the amplifier 1100 may be approximately 250 volts, and the maximum voltage $V_{DS}$ of the transistor 1103 of the amplifier 1100 may be approximately 890 volts. Therefore, when designing a wireless charging system for an electric car, the breakdown threshold of voltage $V_{DS}$ of the transistor used in the amplifier would be critical. If a transistor has a higher breakdown threshold of voltage $V_D$, the cost of the transistor would be higher or the volume of the transistor would be relatively greater.

On the other hand, since the breakdown threshold of voltage $V_{DS}$ is critical, the range of input voltage of the amplifier is limited.

In a class-E amplifier, the range of a load for realizing a zero voltage switch (ZVS) is narrow. A class-E amplifier with a ZVS circuit may only be operated at a fixed frequency and at a fixed duty cycle. The output of a class-E amplifier with a ZVS circuit may be adjusted only by adjusting the output of a pre-stage amplifier or a pre-stage convertor (i.e., adjusting the input voltage of the class-E amplifier).

Additionally, voltage $V_{DS}$ and current $I_D$ are only positive. When voltage $V_{DS}$, which only includes a positive voltage, is provided to a resonator, second harmonic become significant. Harmonics may decrease the performance of generation, transmission, or use of electric power. The second harmonic may decrease the performance of transmission between two resonators. On the other hand, the output voltages with both positive and negative values, such as the output voltages of amplifiers 400 and 900 in FIGS. 2, 8 and 12 may have less second harmonic generation.

Figure 17:
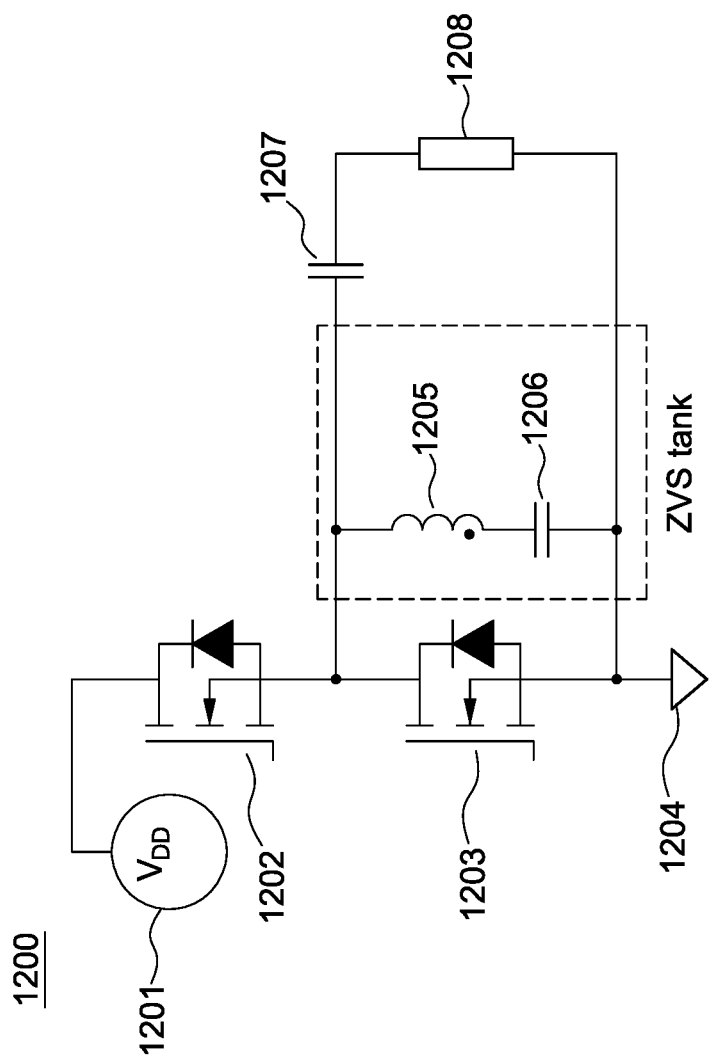
FIG. 17 is a schematic circuit diagram of an amplifier according to some embodiments of the present disclosure.

FIG. 17 is a schematic circuit diagram of an amplifier 1200 according to some embodiments of the present disclosure. The amplifier 1200 may be used as the power amplifier 113 shown in FIG. 1. The amplifier 1200 may include a class-D amplifier. The amplifier 1200 may include an input voltage 1201 that provides the voltage $V_{DD}$, the ground 1204, transistors 1202 and 1203, an inductor 1205, capacitors 1206 and 1207 and a load 1208.

Figure 18:
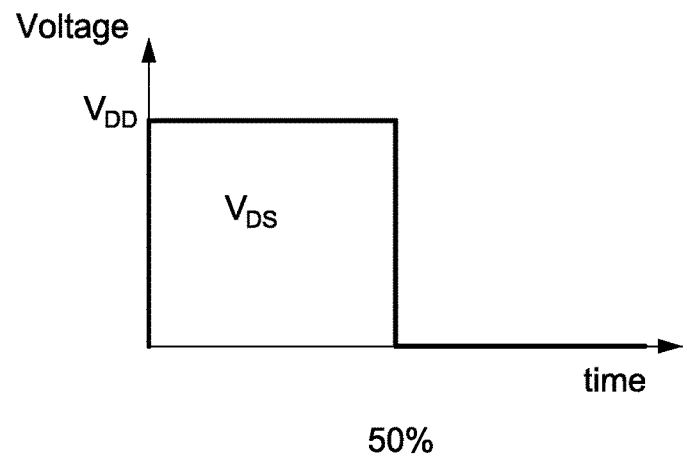
FIG. 18 illustrates a waveform of voltage of an amplifier according to some embodiments of the present disclosure.

FIG. 18 illustrates a waveform of the amplifier 1200 according to some embodiments of the present disclosure, where the X-axis represents time and the Y-axis represents voltage. FIG. 18 illustrates the waveform of voltage $V_{DS}$, where the voltage $V_{DS}$ indicates the voltage difference (or electric potential difference) between the drain and the source of the transistor 1203.

Figure 19:
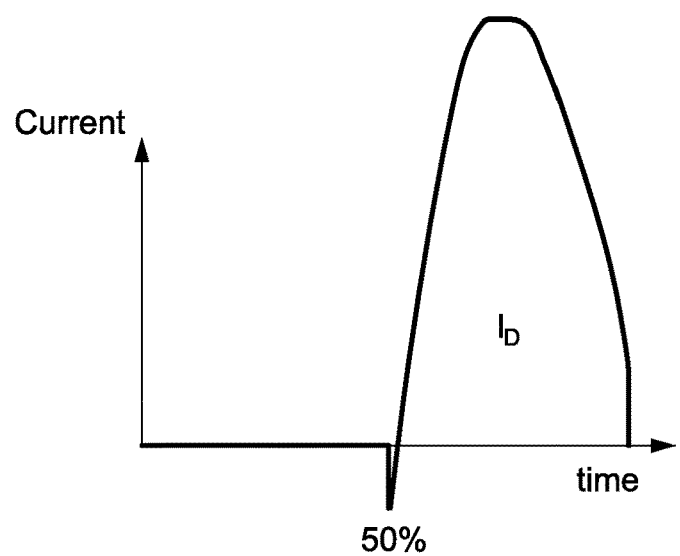
FIG. 19 illustrates a waveform of current of an amplifier according to some embodiments of the present disclosure.

FIG. 19 illustrates a waveform of current of the amplifier 1200 according to some embodiments of the present disclosure, where the X-axis represents time and the Y-axis represent current. FIG. 19 illustrates the waveform of current $I_D$, where the current $I_D$ indicates the current flows through the load 1208.

Figure 20:
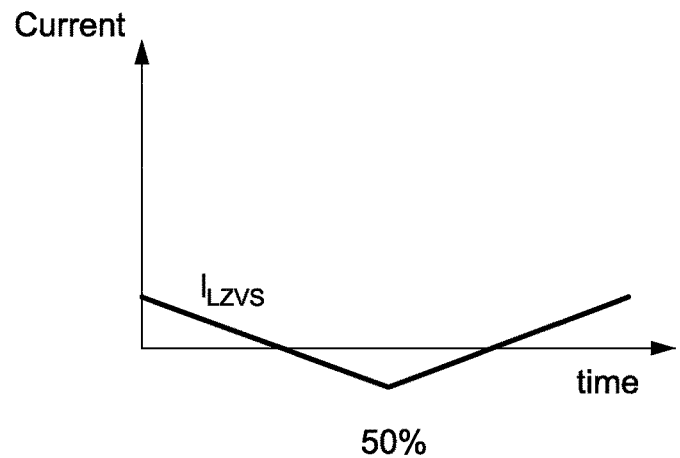
FIG. 20 illustrates a waveform of current of an amplifier according to some embodiments of the present disclosure.

FIG. 20 illustrates a waveform of current of the amplifier 1200 according to some embodiments of the present disclosure, where the X-axis represents time and the Y-axis represent current. FIG. 20 illustrates the waveform of current $I_{LZVS}$, where the current $I_{LZVS}$ indicates the current flows through the inductor 1205.

The Y-axes in FIGS. 18-20 may be aligned. The waveforms in FIGS. 18-20 show a duty cycle of the amplifier 1200. At half of the duty cycle (e.g., the position marked with "50%), voltage $V_{DS}$ is zero, and current $I_D$ is negative. At the end of the duty cycle, the magnitude of current $I_D$ drops to zero.

In a class-D amplifier, the output current (e.g., current $I_D$ in FIG. 19) may be adjusted by adjusting the duty cycle of the transistors (e.g., transistor 1202 and 1230 in FIG. 17). Adjusting the out current through adjusting the duty cycle of the transistors may cause second harmonic. The second harmonic may decrease the performance of transmission between two resonators. The output voltage of a class-D amplifier thus may be adjusted through adjusting the input voltage of the class-D amplifier.

FIG. 18 shows that the maximum voltage $V_{DS}$ is approximately equal to voltage $V_{DD}$. In a wireless charging system for electric cars, the input voltage 1201 may be approximately 250 volts, and the maximum voltage $V_{DS}$ of the transistor 1203 may be approximately 250 volts. Therefore, when designing a wireless charging system for an electric car, the breakdown threshold of voltage $V_{DS}$ of the transistor used in the amplifier would be critical.

The combination of the inductor 1205 and the capacitor 1206 may act as a zero-voltage-switching (ZVS) tank. $I_{LZVS}$ shown in FIG. 24 indicates that the current flows through the inductor 1205. The ZVS tank makes the amplifier 1200 switch when voltage $V_{DS}$ is zero. In particular, the ZVS tank makes the current $I_D$ flow when voltage $V_{DS}$ is zero. With the ZVS tank, the switching loss may be decreased, and the performance may be increased. Additionally, the EMI (electromagnetic Interference) may be improved, the switching frequency may be increased, and the inductance and capacitance of the amplifier may be decreased.

Figure 21:
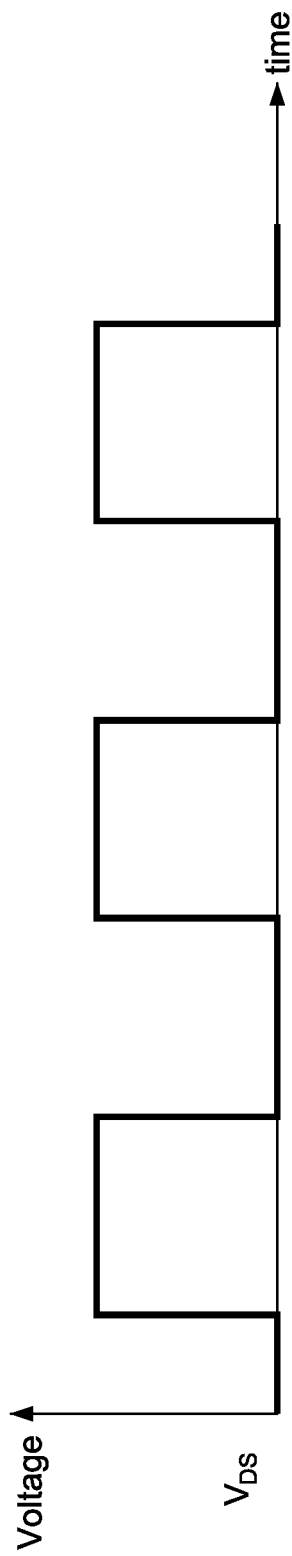
FIG. 21 illustrates a waveform of voltage of an amplifier according to some embodiments of the present disclosure.

FIG. 21 is a waveform of voltage of the amplifier 1200 according to some embodiments of the present disclosure. In particular, FIG. 21 illustrates a waveform of voltage $V_{DS}$ in several duty cycles. Voltage $V_{DS}$ is only positive. When voltage $V_{DS}$, which only includes a positive voltage, is provided to a resonator, second harmonic may be generated. Harmonics may decrease the performance of generation, transmission, or use of electric power. The second harmonic may decrease the performance of transmission between two resonators. On the other hand, the output voltages with both positive and negative values, such as the output voltages of amplifiers 400 and 900 in FIGS. 2, 8 and 12 may have less second harmonic generation.

As used herein, for ease of description, space-related terms such as "under," "below," "lower portion," "above," "upper portion," "lower portion," "left side," "right side," and the like may be used to describe a relationship between one component or feature and another component or feature as shown in the figures. In addition to orientation shown in the figures, space-related terms are intended to encompass different orientations of the device in use or operation. An apparatus may be oriented in other ways (rotated approximately 90 degrees or at other orientations), and the space-related descriptors used herein may also be used for explanation accordingly. It should be understood that when a component is "connected" or "coupled" to/with another component, the component may be directly connected to or coupled to another component, or an intermediate component may exist.

As used in the present disclosure, the terms "approximately," "basically," "substantially," and "about" are used for describing and explaining a small variation. When used in combination with an event or circumstance, the terms may refer to a case in which the event or circumstance occurs precisely, or a case in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all the ranges disclosed in the present disclosure include endpoints. The term "substantially coplanar" may refer to two surfaces within a few micrometers (µm) positioned along the same plane, for example, within 10 µm, within 5 µm, within 1 µm, or within 0.5 µm located along the same plane. When reference is made to "substantially" the same numerical value or characteristic, the term may refer to a value within ±10%, ±5%, ±1%, or ±0.5% of the average of the values.

Several embodiments of the present disclosure, features and details thereof are briefly described above. The embodiments described in the present disclosure may be easily used as a basis for designing or modifying other processes and structures for realizing the same or similar objectives and/or obtaining the same or similar advantages introduced in the embodiments of the present disclosure. Such equivalent construction does not depart from the spirit and scope of the present disclosure, and various variations, replacements, and modifications can be made without departing from the spirit and scope of the present disclosure.

What is claimed is:

1. An electronic circuit, comprising:
    a first transistor including a first electrode coupled with an input voltage and a second electrode;
    a second transistor including a first electrode coupled with the second electrode of the first transistor and a second electrode coupled to a ground;
    a first capacitor coupled between the first electrode of the first transistor and the second electrode of the second transistor;
    a first diode including a first terminal coupled with the first electrode of the first transistor and a second terminal;
    a second diode including a first terminal coupled with the second terminal of the first diode and a second terminal coupled with the second electrode of the second transistor;
    a second capacitor coupled between the first electrode of the first transistor and the second terminal of the first diode;
    a third capacitor coupled between the second terminal of the first diode and the second electrode of the second transistors;
    a third transistor including a first electrode coupled with the input voltage and a second electrode coupled with the first electrode of the first transistor;
    a fourth transistor including a first electrode coupled with the second electrode of the second transistor and a second electrode coupled with the ground; and
    an impedance circuit and a coil, wherein the impedance circuit and the coil are coupled between the second terminal of the first diode and the second electrode of the first transistor;
    wherein the first transistor and the second transistor are conducted alternatively.

2. The electronic circuit of claim 1, wherein the third transistor and the fourth transistor are conducted alternatively.

3. The electronic circuit of claim 2, wherein a phase difference between a first conducting cycle of the first transistor and a second conducting cycle of the third transistor is smaller than approximately 90 degrees.

4. The electronic circuit of claim 1, further comprising:
    a first zero voltage switching circuit is coupled between the first electrode and the second electrode of the first transistor.

5. The electronic circuit of claim 4, wherein the first zero voltage switching circuit comprises a fourth capacitor and a first inductor.

6. The electronic circuit of claim 1, further comprising:
    a second zero voltage switching circuit is coupled between the first electrode and the second electrode of the fourth transistor.

7. The electronic circuit of claim 6, wherein the second zero voltage switching circuit comprises a fifth capacitor and a second inductor.

8. The electronic circuit of claim 1, wherein at least one of the first transistor, the second transistor, the third transistor, and the fourth transistor include high-electron-mobility transistors (HEMT).

9. The electronic circuit of claim 1, wherein the first transistor, the second transistor, the third transistor, and the fourth transistor include at least one p-type metal-oxide-semiconductor field-effect Transistors (PMOSFET).

10. The electronic circuit of claim 1, wherein the first transistor, the second transistor, the third transistor, and the fourth transistor include at least one n-type metal-oxide-semiconductor field-effect Transistor (NMOSFET).

11. The electronic circuit of claim 1, wherein a voltage across the first capacitor corresponds to half of the input voltage.

12. The electronic circuit of claim 1, wherein a voltage across the first electrode and the second electrode of the first transistor, the second transistor, the third transistor, or the fourth transistor is smaller than half of the input voltage.

13. An integrated circuit comprising the electronic circuit of claim 1.

14. A semiconductor device comprising the electronic circuit of claim 1.

15. A circuit board comprising the electronic circuit of claim 1.

\* \* \* \* \*